United States Patent
Yu et al.

(10) Patent No.: US 11,427,929 B2
(45) Date of Patent: Aug. 30, 2022

(54) WAFER SUPPORTING MECHANISM, CHEMICAL VAPOR DEPOSITION APPARATUS, AND EPITAXIAL WAFER MANUFACTURING METHOD

(71) Applicant: SHOWA DENKO K.K., Tokyo (JP)

(72) Inventors: Jia Yu, Yokohama (JP); Naoto Ishibashi, Chichibu (JP); Keisuke Fukada, Chichibu (JP); Tomoya Utashiro, Hikone (JP); Hironori Atsumi, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 253 days.

(21) Appl. No.: 16/063,391

(22) PCT Filed: Dec. 12, 2016

(86) PCT No.: PCT/JP2016/086898
§ 371 (c)(1),
(2) Date: Jun. 18, 2018

(87) PCT Pub. No.: WO2017/110552
PCT Pub. Date: Jun. 29, 2017

(65) Prior Publication Data
US 2018/0371640 A1    Dec. 27, 2018

(30) Foreign Application Priority Data
Dec. 21, 2015    (JP) .............................. JP2015-249024

(51) Int. Cl.
*C30B 25/12*    (2006.01)
*C23C 16/458*    (2006.01)
(Continued)

(52) U.S. Cl.
CPC .............. *C30B 25/12* (2013.01); *C23C 16/44* (2013.01); *C23C 16/458* (2013.01);
(Continued)

(58) Field of Classification Search
CPC ....... C30B 25/12; C30B 25/14; C30B 25/105; C23C 16/44; C23C 16/458; H01L 21/205;
(Continued)

(56) References Cited

U.S. PATENT DOCUMENTS

| 5,820,367 | A  |   | 10/1998 | Osawa |
| 6,309,163 | B1 | * | 10/2001 | Nering .................. G03F 7/7075 |
|           |    |   |         | 414/331.01 |

(Continued)

FOREIGN PATENT DOCUMENTS

| CN | 101123175 A | 2/2008 |
| CN | 103210475 A | 7/2013 |

(Continued)

OTHER PUBLICATIONS

International Search Report for PCT/JP2016/086898 dated Feb. 28, 2017 [PCT/ISA/210].

(Continued)

*Primary Examiner* — Charlee J. C. Bennett
(74) *Attorney, Agent, or Firm* — Sughrue Mion, PLLC

(57) ABSTRACT

A wafer supporting mechanism including: a wafer supporting table; and a movable part supported by the wafer supporting table, wherein the wafer supporting table includes a wafer supporting portion for transfer that stands up from a first surface opposing a back surface of a wafer to be placed and is provided further toward an inner side than an outer peripheral edge of the wafer to be placed, and the movable part includes a wafer supporting portion for film formation that is positioned further toward an outer peripheral side of the wafer to be placed than the wafer supporting portion for transfer and is relatively movable with respect to the wafer supporting table in a standing direction of the wafer supporting portion for transfer.

16 Claims, 8 Drawing Sheets

(51) Int. Cl.
  *H01L 21/677* (2006.01)
  *H01L 21/687* (2006.01)
  *H01L 21/31* (2006.01)
  *H01L 21/205* (2006.01)
  *C23C 16/44* (2006.01)
  *H01L 21/673* (2006.01)
  *C30B 25/10* (2006.01)
  *C30B 25/14* (2006.01)

(52) U.S. Cl.
  CPC ............ *C30B 25/105* (2013.01); *C30B 25/14* (2013.01); *H01L 21/205* (2013.01); *H01L 21/31* (2013.01); *H01L 21/67346* (2013.01); *H01L 21/67748* (2013.01); *H01L 21/68764* (2013.01)

(58) Field of Classification Search
  CPC .............. H01L 21/31; H01L 21/67346; H01L 21/67748; H01L 21/68764
  USPC .......................................................... 118/729
  See application file for complete search history.

(56) References Cited

U.S. PATENT DOCUMENTS

| | | | |
|---|---|---|---|
| 2002/0182892 A1 | 12/2002 | Arai et al. | |
| 2003/0180127 A1* | 9/2003 | Kuroda | H01L 21/681 414/217 |
| 2005/0158164 A1* | 7/2005 | Lee | H01L 21/67309 414/791.4 |
| 2009/0272323 A1* | 11/2009 | Ito | H01L 21/6875 118/725 |
| 2010/0071624 A1* | 3/2010 | Lee | H01L 21/68735 118/729 |
| 2010/0075509 A1 | 3/2010 | Hirata et al. | |
| 2011/0107970 A1* | 5/2011 | Hong | H01L 21/67109 118/724 |
| 2011/0114014 A1 | 5/2011 | Sakurai et al. | |
| 2012/0234243 A1* | 9/2012 | Olgado | C23C 16/4584 118/730 |
| 2012/0247671 A1* | 10/2012 | Sugawara | H01L 21/68728 156/345.31 |
| 2013/0000546 A1 | 1/2013 | Suzuki et al. | |

FOREIGN PATENT DOCUMENTS

| | | |
|---|---|---|
| JP | 9-092625 A | 4/1997 |
| JP | 10-022226 A | 1/1998 |
| JP | 2583675 Y2 | 10/1998 |
| JP | 2001-176808 A | 6/2001 |
| JP | 2001-210597 A | 8/2001 |
| JP | 2001-300869 A | 10/2001 |
| JP | 2005-223142 A | 8/2005 |
| JP | 2008-211109 A | 9/2008 |
| JP | 2011-014682 A | 1/2011 |
| JP | 2012-028385 A | 2/2012 |
| JP | 2012-084691 A | 4/2012 |
| KR | 10-2013-0051570 A | 5/2013 |
| KR | 10-2015-0011328 A | 1/2015 |
| WO | 99/26280 A1 | 5/1999 |
| WO | 00/43567 A1 | 7/2000 |
| WO | 2005/076343 A1 | 8/2005 |
| WO | 2006/108783 A1 | 10/2006 |
| WO | 2015/001975 A1 | 1/2015 |

OTHER PUBLICATIONS

Communication dated Jul. 19, 2019 from European Patent Office in counterpart application No. EP 16878443.7.
Communication dated Jun. 23, 2020, issued by the Korean Intellectual Property Office in Korean Application No. 10-2018-7016953 (Notice of Allowance).
Communication dated Jan. 26, 2022 from the Chinese Patent Office in Chinese Application No. 201680071748.8.
Fan Chenyang et al., "MEMS Slide Block Locking Mechanism on the Basis of A Flexible Supporting Structure", Journal of Detection & Control, 2014, vol. 36, No. 1, pp. 37-41 (5 pages total).
Shi Yonggui et al., "Thermal Stress Analysis of Crystal Morphology in Growth of Silicon Carbide Bulk Crystal by PVT Method", Journal of Xi'An Jiaotong University, 2011, vol. 45, No. 1, pp. 117-121 (5 pages total).
Office Action dated May 16, 2022 in Chinese Application No. 201680071748.8.

* cited by examiner

WAFER SUPPORTING MECHANISM, CHEMICAL VAPOR DEPOSITION APPARATUS, AND EPITAXIAL WAFER MANUFACTURING METHOD

CROSS REFERENCE TO RELATED APPLICATIONS

This application is a National Stage of International Application No. PCT/JP2016/086898, filed on Dec. 12, 2016, which claims priority from Japanese Patent Application No. 2015-249024, filed on Dec. 21, 2015.

TECHNICAL FIELD

The present invention relates to a wafer supporting mechanism, a chemical vapor deposition apparatus, and a method of manufacturing an epitaxial wafer.

BACKGROUND ART

A chemical vapor deposition (CVD) method has been known as methods for forming a thin film layer on a substrate. For example, a SiC epitaxial layer is formed on a SiC wafer by using a chemical vapor deposition apparatus to produce a SiC epitaxial wafer.

In chemical vapor deposition, a cycle of processes has been carried out in which wafers are inserted, either one by one or several wafers at the same time, into a reaction space in an epitaxial reaction furnace, an epitaxial layer is formed on the inserted wafer, and the wafer is taken out after completion of film formation.

Hereinafter, in this specification, a wafer before epitaxial layer formation is simply referred to as "wafer", and a wafer after epitaxial layer formation is referred to as "epitaxial wafer".

In the production site, it is required to shorten one cycle from wafer insertion to removal in chemical vapor deposition in order to increase the number of products per unit time and increase the production efficiency. Accordingly, in order to shorten the time required to raise and lower the temperature in the film formation space, high temperature transfer is performed in which the inside of the film formation space is maintained at a high temperature and the wafer is transferred to the high-temperature film formation space.

However, if only a wafer alone is transferred into a high-temperature film formation space, a shape change such as distortion or deflection may occur to the wafer due to a sudden thermal change. The change in the shape of these wafers is remarkable, in particular, in wafers having a large diameter. Patent Document 1 describes that a substrate is transferred while being installed on a susceptor (wafer supporting table) and film formation is performed as it is in order to suppress the shape change of the wafer due to high temperature transfer.

The shape change of the wafer during high temperature transfer becomes more prominent as the temperature difference between the film formation space and the external environment increases. For example, when fabricating a SiC epitaxial wafer, the temperature in the film formation space may be increased up to 1,500° C. or higher. Even during the high temperature transfer, the temperature of the film formation space is as high as 700 to 1,200° C. Patent Document 2 describes that in a CVD apparatus for manufacturing a SiC epitaxial wafer requiring high temperature growth, a susceptor on which a wafer is carried is transferred using a transfer robot.

Patent Document 3 describes that when the entire wafer surface is placed on a susceptor, the wafer warps concavely toward the wafer front surface side due to heating from the back surface. In addition, as means for suppressing problems caused by such warpage, it is described that the wafer is supported only at the peripheral edge portion of the wafer.

CITATION LIST

Patent Documents

Patent Document 1: Japanese Unexamined Patent Application, First Publication No. Hei 10-22226
Patent Document 2: Japanese Unexamined Patent Application, First Publication No. 2012-28385
Patent Document 3: Japanese Unexamined Patent Application, First Publication No. 2011-14682

SUMMARY OF INVENTION

Technical Problem

However, in the susceptors described in Patent Documents 1 to 3, the thermal stress applied to the wafer cannot be sufficiently alleviated, and there has been a problem of cracking of the wafer or the like before growing an epitaxial layer. Such a problem was prominent in the case where the temperature of the film formation space was high and in the case where the wafer had a large diameter.

The present invention takes the above problems into consideration, and has an object of providing a wafer supporting mechanism which is capable of suppressing breakage of a wafer caused by the thermal stress applied to the wafer, a chemical vapor deposition apparatus, and a method of manufacturing an epitaxial wafer.

Solution to Problem

As a result of intensive studies, the inventors of the present invention have found that by changing the position for supporting the wafer at the time of high temperature transfer and the position for supporting the wafer at the time of film formation process, breakage of the wafer due to the thermal stress applied to the wafer can be suppressed.

That is, the present invention provides the following procedures in order to solve the above problems.

(1) A wafer supporting mechanism according to one aspect of the present invention includes: a wafer supporting table; and a movable part supported by the aforementioned wafer supporting table, wherein the aforementioned wafer supporting table includes a wafer supporting portion for transfer, which stands up from a first surface opposing a back surface of a wafer to be placed and is provided further toward an inner side than an outer peripheral edge of the wafer to be placed, and the aforementioned movable part includes a wafer supporting portion for film formation, which is positioned further toward an outer peripheral side of the wafer to be placed than the aforementioned wafer supporting portion for transfer and is relatively movable with respect to the aforementioned wafer supporting table in a standing direction of the aforementioned wafer supporting portion for transfer.

(2) In the wafer supporting mechanism according to the above (1), a diameter of a circle formed by the aforementioned wafer supporting portion for transfer may be equal to or less than 97% of a diameter of the wafer to be placed.

(3) In the wafer supporting mechanism according to either one of the above (1) and (2), at least a part of the aforementioned movable part may be protruded from a second surface opposite to the first surface of the aforementioned wafer supporting table to form a push-up portion.

(4) In the wafer supporting mechanism according to any one of the above (1) to (3), it may be configured to further include an installation part for installing the aforementioned wafer supporting mechanism, wherein by installing the aforementioned wafer supporting mechanism in the aforementioned installation part, the aforementioned movable part may be pushed up by the aforementioned installation part, and a support position of the aforementioned wafer is switchable from the aforementioned wafer supporting portion for transfer to the aforementioned wafer supporting portion for film formation.

(5) A wafer supporting mechanism according to one aspect of the present invention includes: a wafer supporting table having a through hole formed therein; a wafer supporting portion for transfer which stands up from a first surface opposing a back surface of a wafer to be placed on the aforementioned wafer supporting table and is provided further toward an inner side than the aforementioned through hole and an outer peripheral edge of the wafer to be placed; a wafer supporting portion for film formation that is insertable into the aforementioned through hole; and an installation part for installing the aforementioned wafer supporting table, wherein by installing the aforementioned wafer supporting table in the aforementioned installation part, the aforementioned wafer supporting portion for film formation is inserted into the through hole of the aforementioned wafer supporting table and a support position of the aforementioned wafer is switchable from the aforementioned wafer supporting portion for transfer to the aforementioned wafer supporting portion for film formation.

(6) A chemical vapor deposition apparatus according to one aspect of the present invention includes the wafer supporting mechanism according to any one of the above (1) to (5).

(7) A method of manufacturing an epitaxial wafer according to one aspect of the present invention includes: a placing step of placing a wafer on a wafer supporting portion for transfer in a wafer supporting table; a transfer step of transferring the aforementioned wafer together with the aforementioned wafer supporting table from the transfer space into a film formation space having a high temperature than that of the aforementioned transfer space; and a film formation step of installing the aforementioned transferred wafer supporting table in the aforementioned film formation space and forming a layer on the aforementioned wafer, wherein in a process from the aforementioned transfer step to the aforementioned film formation step, a position for supporting the aforementioned wafer is switched from the aforementioned wafer supporting portion for transfer to a wafer supporting portion for film formation that is positioned further toward an outer peripheral side of the wafer than the aforementioned wafer supporting portion for transfer.

(8) In the method of manufacturing an epitaxial wafer according to the above (7), a temperature of the aforementioned film formation space may be 700° C. or higher.

Advantageous Effects of Invention

According to the wafer supporting mechanism, the chemical vapor deposition apparatus and the method of manufacturing an epitaxial wafer according to one aspect of the present invention, it is possible to suppress the breakage of the wafer due to the thermal stress applied to the wafer.

DESCRIPTION OF EMBODIMENTS

Figure 1:
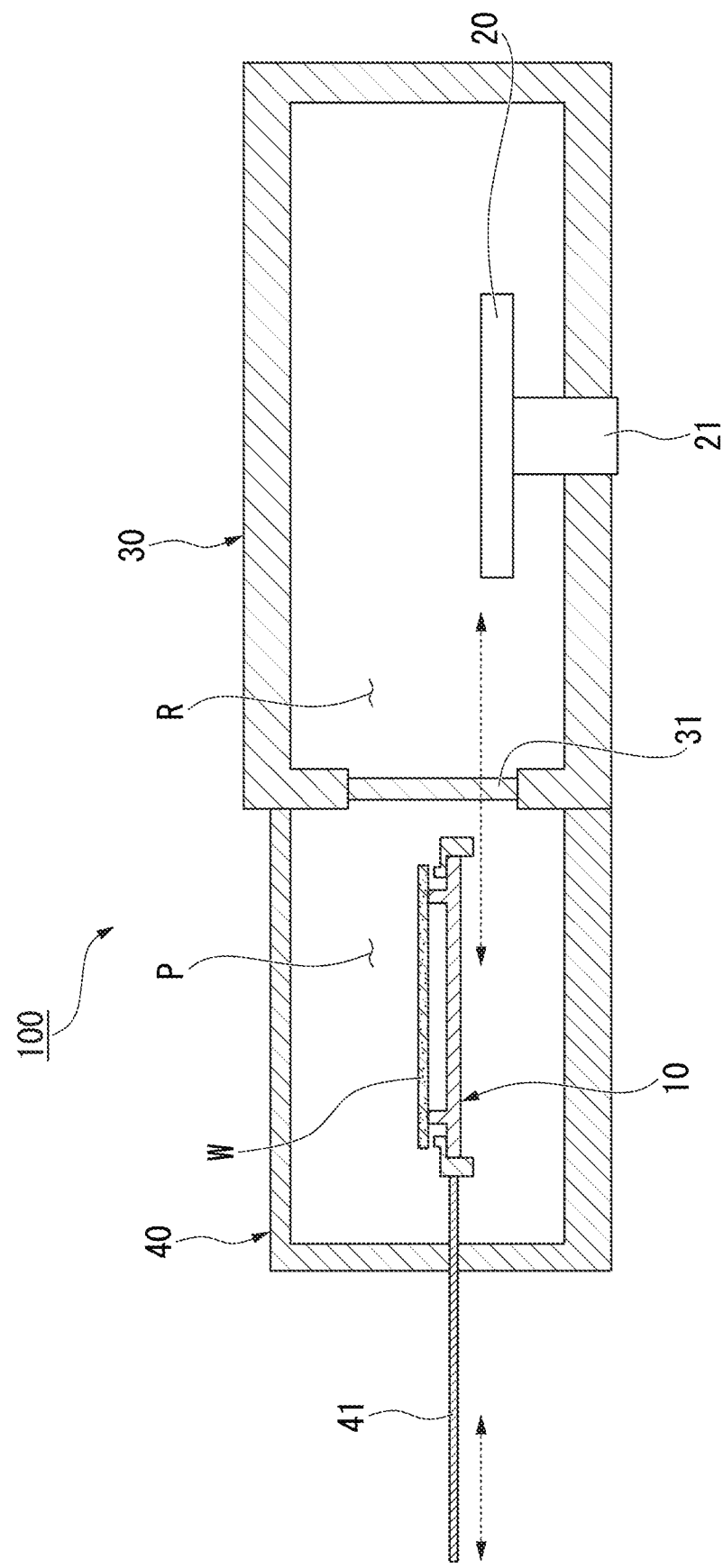
FIG. 1 shows a schematic cross-sectional view of a chemical vapor deposition apparatus according to one aspect of the present invention.

Hereinafter, a wafer supporting mechanism, a chemical vapor deposition apparatus, and a method of manufacturing an epitaxial wafer according to one aspect of the present invention will be described in detail with appropriate reference to the drawings. In the drawings used in the following description, characteristic portions and components may be shown in an enlarged manner in some cases for the sake of simplicity in order to facilitate understanding of the characteristics of the present invention, and the dimensional ratio and the like of each constituent may be different from that employed in reality. Materials, dimensions, and the like illustrated in the following description are merely examples, and the present invention is not limited thereto and can be carried out with appropriate modifications without departing from the scope and spirit of the invention.

<Chemical Vapor Deposition Apparatus>

FIG. 1 is a schematic cross-sectional view of a chemical vapor deposition apparatus according to one aspect of the present invention.

A chemical vapor deposition apparatus 100 shown in FIG. 1 has a furnace body for forming a film formation space R and a preparation chamber 40 for forming a transfer space P. The furnace body 30 and the preparation chamber 40 are partitioned by a shutter 31. An installation part 20 for installing a wafer supporting mechanism 10 on which a wafer W is placed is provided below the furnace body 30. The installation part 20 is supported by a supporting column 21, and the supporting column 21 is rotatable. In the furnace body 30, a gas supply pipe and a heater and the like (not shown) are installed. The gas supply pipe supplies a source gas, a carrier gas, an etching gas, and the like to the film formation space R, and the heater heats the inside of the film formation space R.

In this specification, the film formation surface side of the wafer W may be referred to as being above, and the side opposite to the film formation surface may be referred to as being below.

The wafer W is placed on the wafer supporting mechanism 10. The wafer supporting mechanism 10 on which the wafer W is placed is transferred to the furnace body 30 by an arm 41 after opening the shutter 31 which is provided between the preparation chamber 40 and the furnace body 30.

Figure 2:
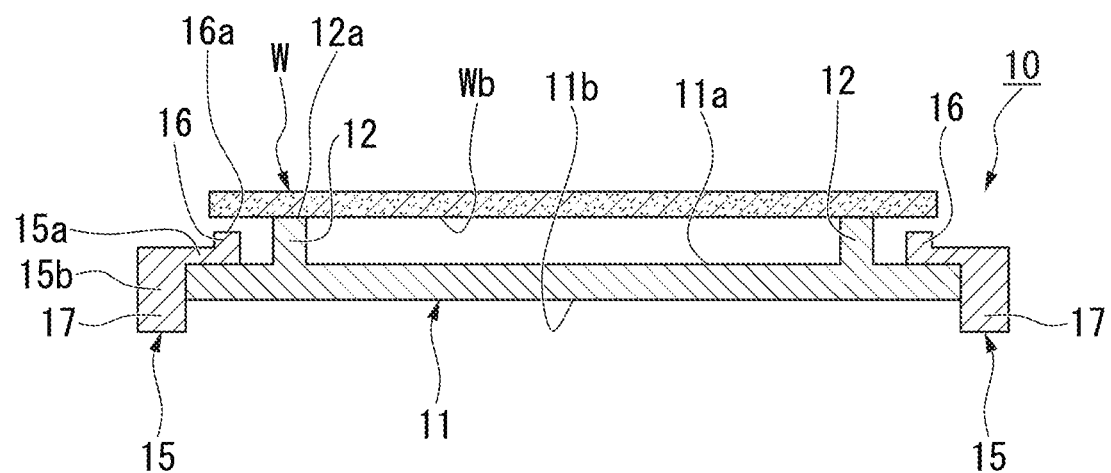
FIG. 2 shows a schematic cross-sectional view of a wafer supporting mechanism according to one aspect of the present invention.
Figure 3:
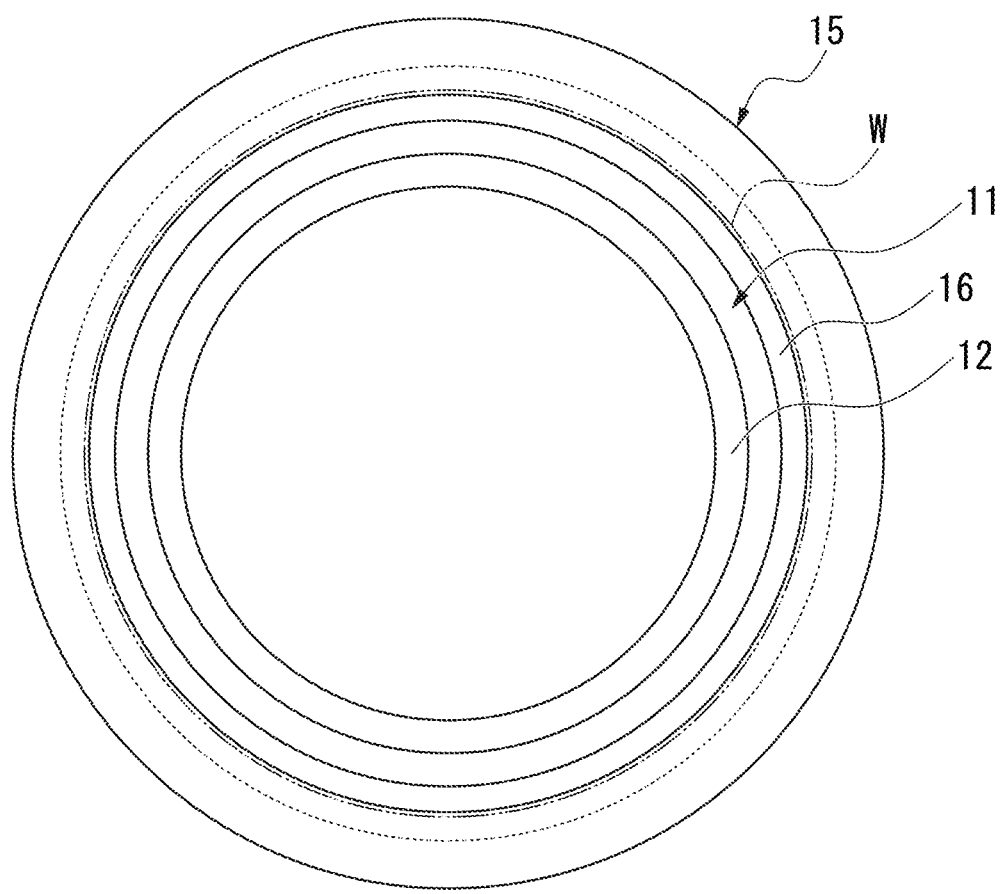
FIG. 3 shows a schematic plan view of a wafer supporting mechanism according to one aspect of the present invention.

FIG. 2 is a schematic cross-sectional view of a wafer supporting mechanism according to one aspect of the present invention. FIG. 3 is a schematic plan view of the wafer supporting mechanism according to the present embodiment. In FIGS. 2 and 3, in order to facilitate understanding, the wafer W is shown at the same time. The wafer supporting mechanism 10 shown in FIG. 2 is separated into and configured by a wafer supporting table 11 and a movable part 15.

The wafer supporting table 11 has a wafer supporting portion for transfer 12 that stands up from a first surface 11a facing a back surface Wb of the placed wafer W. As shown in FIG. 3, the wafer supporting portion for transfer 12 is provided, in plan view, further inside than the outer periphery of the wafer W to be placed. More specifically, the outer periphery of the wafer supporting portion for transfer 12 is present, preferably 2 mm or more, and more preferably 6 mm or more, toward the inner side than the outer periphery of the wafer W. Further, the diameter of a circle formed by the wafer supporting portion for transfer 12 is preferably 97% or less, more preferably 92% or less, and still more preferably 80% or less of the diameter of the wafer W to be placed.

As for the width or position of the wafer supporting portion for transfer, a suitable width or position can be selected depending on the size of the wafer and the structure of the movable part and the wafer supporting portion for film formation that are supported by the wafer supporting table.

It should be noted that in the case of the surface contact where the wafer supporting portion for transfer has a width in the radial direction, the "outer periphery of the wafer supporting portion for transfer" indicates the outer peripheral edge of the supporting portion. Further, likewise, "the diameter of a circle formed by the wafer supporting portion for transfer" indicates the diameter of a circle serving as the outer periphery of the wafer supporting portion for transfer. Furthermore, when the wafer supporting portion for transfer having a width is not a circle but a set of arcs, similar definitions are applied by regarding the circumscribed circle thereof as the outer periphery.

The thermal stress applied to the wafer W when the wafer W is transferred at a high temperature reaches the maximum at a portion supporting the wafer W. In general, the wafer supporting mechanism 10 has a larger heat capacity than that of the wafer W, and is more difficult to be heated than the wafer when transferred at a high temperature. Accordingly, during high temperature transfer, the wafer supporting mechanism 10 is in a state of having a lower temperature than that of the wafer W. Therefore, the heat of the wafer W escapes from the portion which is in contact with the wafer supporting portion for transfer 12 to the supporting portion having a relatively low temperature. As a result, the wafer temperature at the portion which is in contact with the wafer supporting portion for transfer 12 is lowered, and a temperature distribution is formed within the wafer W. It is due to this temperature distribution that the thermal stress applied to the wafer W reaches the maximum at the portion where the wafer W is supported.

Further, in the wafer W, the breaking strength of the outer peripheral portion is smaller than the inner breaking strength. Therefore, when a stress is applied to the outer peripheral portion rather than to the inner peripheral portion, the wafer easily cracks. In order to suppress the cracking of the wafer, it is important to reduce the stress to the outer peripheral portion. By setting the position of the wafer supporting portion for transfer 12, that supports the wafer W during transfer, further inside than the outer periphery of the wafer W to be placed, it is possible to reduce the stress to the outer peripheral portion and to suppress the cracking of the wafer.

On the other hand, when the wafer supporting portion for transfer 12 is present toward the inner side to a larger extent than the outer periphery of the wafer W, the stability of the wafer W decreases at the time of transfer. For this reason, the diameter of the circle formed by the wafer supporting portion for transfer 12 is preferably 30% or more, and more preferably 50% or more of the diameter of the wafer W to be placed.

Here, the wafer supporting portion for transfer refers to a portion that supports the wafer in a state immediately before the wafer is set to the position used during epitaxial growth. The wafer supporting portion for transfer supports the wafer inside the outer peripheral edge of the wafer in order to suppress cracking of the wafer when the temperature of the wafer and the supporting portion for transfer changes. For example, when transferring the wafer into the furnace, it is conceivable to perform an operation of replacing the wafer in the middle, and in that case, a supporting portion for ultimately moving the wafer to the position which is used at the time of epitaxial growth is the wafer supporting portion for transfer according to the present embodiment.

The movable part 15 is positioned on the outer periphery of the wafer supporting table 11. The movable part 15 shown in FIG. 2 includes an extension portion 15a extending along the wafer supporting table from the outer peripheral edge toward the center of the wafer supporting table 11, and a suspension portion 15b suspended downward from the extension portion 15a. The movable part 15 is supported such that the extension portion 15a is suspended on the wafer supporting table 11. A part of the suspension portion 15b protrudes from the back surface (second surface) 11b of the wafer supporting table 11 and functions as a push-up portion 17.

At the edge portion of the extension portion 15a on the center side of the wafer supporting table 11, a wafer supporting portion for film formation 16 that stands toward the wafer W is provided. The wafer supporting portion for film formation 16 is located further on the outer peripheral side of the wafer W than the wafer supporting portion for transfer 12. An upper surface 16a of the wafer supporting portion for film formation 16 on the wafer W side is present below an upper surface 12a of the wafer supporting portion for transfer 12 on the wafer W side in a state where the movable part 15 is suspended from the wafer supporting table 11.

The movable part 15 can be relatively moved with respect to the wafer supporting table 11 in the standing direction of the wafer supporting portion for transfer 12. When the movable part 15 moves upward, the wafer supporting portion for film formation 16 moves upward together with the movable part 15, so that the upper surface 16a of the wafer supporting portion for film formation 16 and the back surface Wb of the wafer W come into contact. Furthermore, when the wafer supporting portion for film formation 16 is moved upward, the wafer supporting portion for film formation 16 supports the wafer W. That is, the position for supporting the wafer W changes from the wafer supporting portion for transfer 12 to the wafer supporting portion for film formation 16.

Figure 4A:
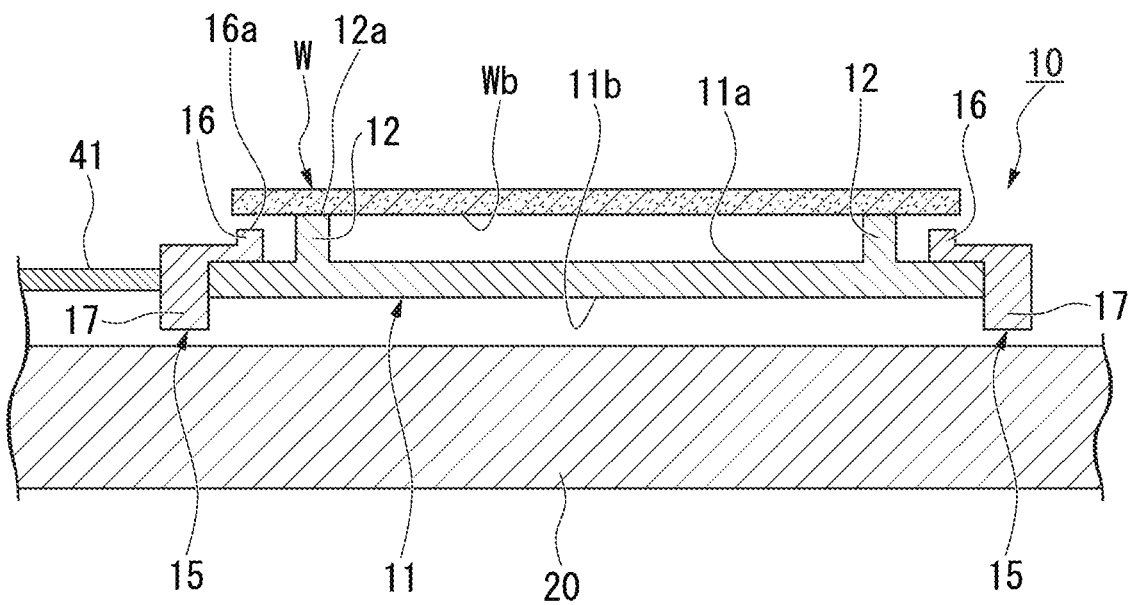
FIG. 4A shows a schematic cross-sectional view of a wafer supporting mechanism for supporting a wafer at the time of transfer.
Figure 4B:
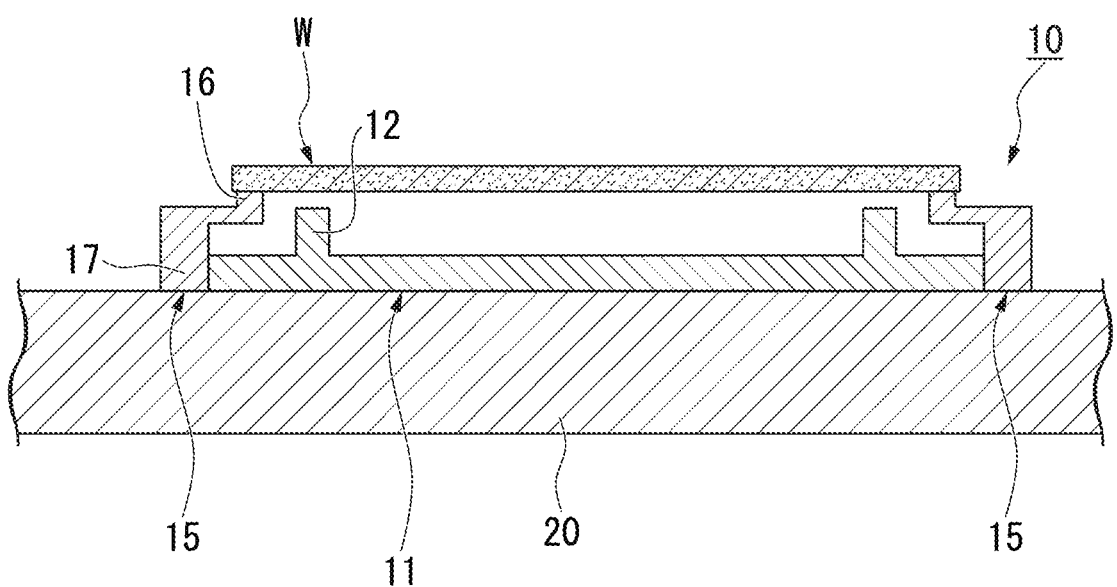
FIG. 4B shows a schematic cross-sectional view of a wafer supporting mechanism for supporting a wafer at the time of film formation.

Hereinafter, with reference to FIGS. 4A and 4B, the operation of the wafer supporting mechanism when installing the wafer supporting mechanism 10 in the installation part 20 will be specifically described. FIG. 4A is a schematic cross-sectional view of a wafer supporting mechanism for supporting a wafer at the time of transfer, and FIG. 4B is a schematic cross-sectional view of a wafer supporting mechanism for supporting the wafer at the time of film formation.

As shown in FIG. 4A, the wafer supporting mechanism 10 is supported and transferred by the arm 41. In a transferred state, the movable part 15 is in a state of being suspended from the wafer supporting table 11. Therefore, as in FIG. 2, a part of the movable part 15 protrudes from the second surface 11b of the wafer supporting table 11. The protruding portion is the push-up portion 17.

In a transferred state, the wafer W is supported by the wafer supporting portion for transfer 12. Therefore, even when the film formation space R in FIG. 1 is at a high temperature, the generated thermal stress per se can be reduced, and the moment generated by the thermal stress can also be reduced. As a result, damage to the wafer W can be prevented.

On the other hand, at the time of film formation, the wafer supporting mechanism 10 is installed on the installation part 20 of the furnace body 30 shown in FIG. 1. Therefore, the push-up portion 17 protruding from the second surface 11b of the wafer supporting table 11 is pushed up by the installation part 20. Accordingly, the entire movable part 15 is pushed upward. As a result, the portion for supporting the wafer W changes from the wafer supporting portion for transfer 12 to the wafer supporting portion for film formation 16.

At the time of film formation, when the wafer W is supported by the wafer supporting portion for film formation 16 located further on the outer peripheral side of the wafer W than the wafer supporting portion for transfer 12, the following advantages are obtained.

When the temperature of the wafer is raised up to the film forming temperature, the wafer warps into a concave shape with respect to the installation part 20. When the wafer supporting portion is on the inner peripheral side of the wafer at the time of film formation, the position of the outer peripheral portion of the warped wafer may be located above the upper surface of a wafer side surface supporting portion which is provided on the outer peripheral side of the wafer in order to suppress positional deviation of the wafer in some cases. In this case, there is nothing to suppress the positional deviation of the wafer from the side surface, and the possibility of occurrence of positional deviation increases. When the wafer deviates from a predetermined position during epitaxial growth, the targeted film formation quality cannot be achieved. On the other hand, when the wafer supporting portion is supported on the outer peripheral side of the wafer, the central portion of the wafer merely shifts downward even if the wafer warps, and the position of the outer peripheral portion of the wafer does not change from the position supported by the wafer supporting portion. That is, the positional relationship between the outer peripheral portion of the wafer and the wafer side surface supporting portion does not change, and positional deviation of the wafer hardly occurs.

It should be noted that since the in-plane temperature of the wafer W is equalized after the wafer W has been transferred into a high temperature environment and some time has elapsed, the thermal stress is alleviated. Therefore, even if the wafer W is supported at the outer peripheral edge portion of the wafer W, the wafer W will not be damaged by the thermal stress.

It is preferable that the position of the wafer supporting portion for film formation 16 is further on the outer peripheral side of the wafer W to be placed than the wafer supporting portion for transfer 12, and at least a part of the wafer supporting portion for film formation 16 is in contact with the outer peripheral edge of the wafer W. By making at least a part of the wafer supporting portion for film formation 16 to be in contact with the outer peripheral edge of the wafer W, positional deviation of the wafer can be suppressed.

Further, in order to enhance the stability of the wafer W during film formation, it is preferable to provide a wafer side surface supporting portion for supporting the side surface of the wafer W as described above in the wafer supporting mechanism 10.

As described above, the chemical vapor deposition apparatus according to the present embodiment supports the wafer W at the time of transfer by the wafer supporting portion for transfer 12 that is provided further inside than the outer periphery of the wafer W to be placed, so that it is possible to avoid breakage of the wafer due to the thermal stress. Especially when using a wafer with a large diameter, or when the temperature before transfer and the temperature after transfer are greatly different, the effect is remarkable. Further, at the time of film formation, since the wafer W is supported by the wafer supporting portion for film formation 16 that is arranged further on the outer peripheral side of the wafer W to be placed than the wafer supporting portion for transfer 12, it is possible to enhance the quality of the obtained epitaxial wafer.

The chemical vapor deposition apparatus according to the present embodiment can be used for chemical vapor deposition in which a wafer is inserted one by one, and also for chemical vapor deposition in which a plurality of wafers are simultaneously inserted, into a reaction space in an epitaxial reaction furnace. The effect is particularly great in the case of an apparatus that transfers wafers one by one because the number of times of transfer is large.

Preferred embodiments of the present invention have been described in detail above. However the present invention is not limited to these embodiments, and various changes and modifications can be made within the scope of the present invention described in the claims.

MODIFIED EXAMPLE

Figure 5:
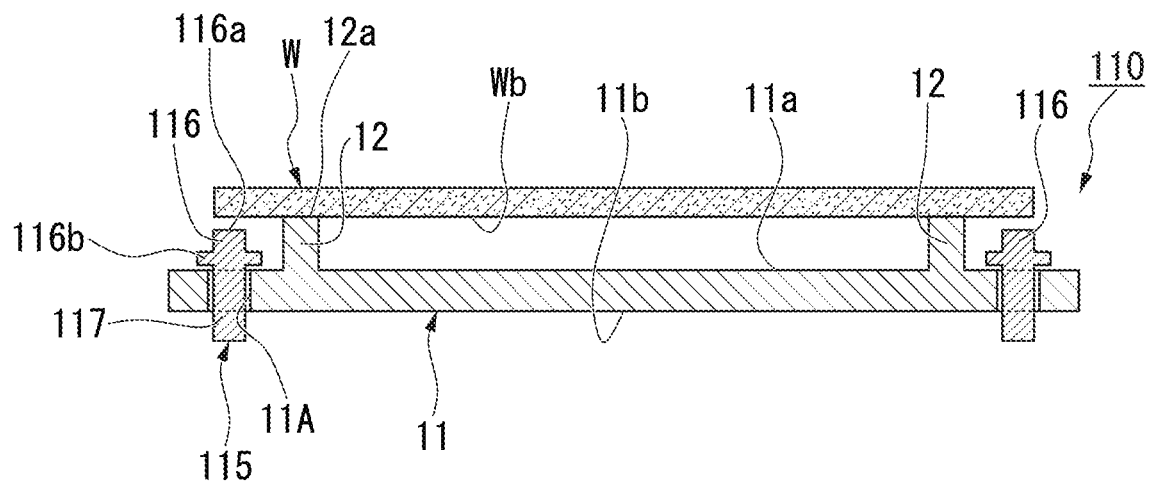
FIG. 5 shows a schematic cross-sectional view of a modified example of a wafer supporting mechanism according to one aspect of the present invention.

For example, the configuration of the wafer supporting mechanism may be configured as shown in FIG. 5. FIG. 5 is a schematic cross-sectional view of a modified example of a wafer supporting mechanism according to one aspect of the present invention. In a wafer supporting mechanism 110 shown in FIG. 5, a movable part 115 having a wafer supporting portion for film formation 116 is inserted in a through hole 11A provided in the wafer supporting table 11. The movable part 115 is suspended from the wafer supporting table 11 by a protrusion portion 116b that stands up in the in-plane direction of the wafer supporting table 11 at the time of transfer.

At the time of film formation, the wafer supporting mechanism 110 is installed in an installation part. A push-up portion 117 of the movable part 115, which is protruding from the second surface 11b of the wafer supporting table 11, is pushed up by the installation part. As a result, the entire movable part 115 is pushed up, and the wafer supporting portion for film formation 116 also moves upward. Then, an upper surface 116a of the wafer supporting portion for film formation 116 comes into contact with the wafer W, and the portion for supporting the wafer W changes from the wafer supporting portion for transfer 12 to the wafer supporting portion for film formation 116.

Since the wafer supporting portion for transfer 12 of the wafer supporting mechanism 110 shown in FIG. 5 is provided further inside than the outer peripheral edge of the wafer to be placed, cracking of the wafer W due to thermal stress can be avoided. In addition, since the wafer supporting portion for film formation 116 in the wafer supporting mechanism 110 is disposed further on the outer peripheral side of the wafer W to be placed than the wafer supporting portion for transfer 12, it is possible to enhance the quality of the obtained epitaxial wafer.

Figure 6:
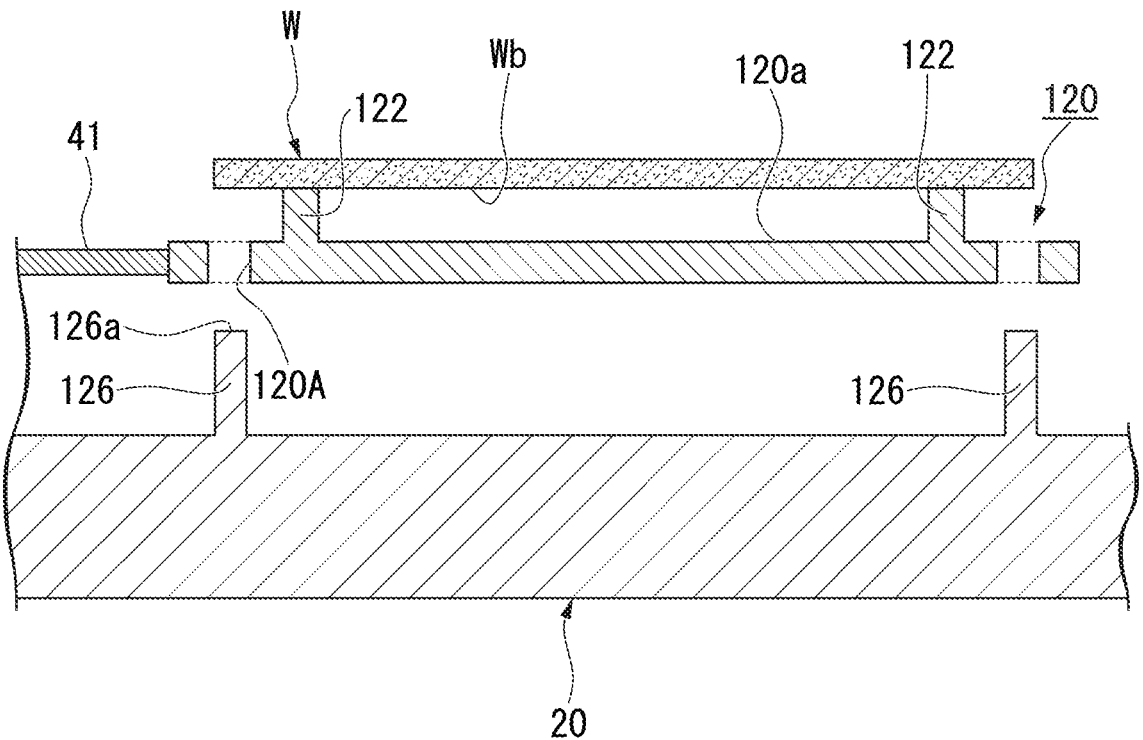
FIG. 6 shows a schematic cross-sectional view of a wafer supporting mechanism according to another aspect of the present invention, which is a diagram showing a state immediately before a susceptor is installed in an installation part.

Further, as shown in FIG. 6, it is also possible to realize a change in the support position of the wafer at the time of transfer and at the time of film formation, by the wafer supporting mechanism and the installation part in which the wafer supporting mechanism is installed.

FIG. 6 is a schematic cross-sectional view of a wafer supporting mechanism according to another embodiment of the present invention, and is a schematic cross-sectional view showing a state immediately before a susceptor is installed in an installation part.

A wafer supporting table 120 shown in FIG. 6 has a wafer supporting portion for transfer 122 that protrudes from a first surface 120a opposing the back surface Wb of the wafer W and is provided further inside than the outer peripheral edge of the wafer to be placed, and a through hole 120A is provided further on the outer peripheral side of the wafer W to be placed than the wafer supporting portion for transfer 122.

In the installation part 20 where the wafer supporting table 120 is installed, a wafer supporting portion for film formation 126 that stands up from a surface of the installation part 20 on the film formation direction side is provided. The position of the wafer supporting portion for film formation 126 corresponds to the position of the through hole 120A of the wafer supporting table 120.

The wafer supporting table 120 shown in FIG. 6 is transferred by the arm 41. When being transferred, the wafer W is supported by the wafer supporting portion for transfer 122 of the wafer supporting table 120. Since the wafer supporting portion for transfer 122 is provided further inside than the outer peripheral edge of the wafer to be placed, cracking of the wafer W due to thermal stress can be avoided.

When installing the wafer supporting table 120 in the installation part 20, the wafer supporting portion for film formation 126 is inserted into the through hole 120A of the wafer supporting table 120. The inserted wafer supporting portion for film formation 126 penetrates the through hole 120A and supports the wafer W. At this time, the height of the wafer supporting portion for film formation 126 is larger than the combined thickness of the wafer supporting portion for transfer 122 and the through hole 120A. As a result, an upper surface 126a of the wafer supporting portion for film formation 126 provided in the installation part 20 comes into contact with the wafer W, and the portion for supporting the wafer W changes from the wafer supporting portion for transfer 122 to the wafer supporting portion for film formation 126.

Since the wafer supporting portion for film formation 126 is disposed further on the outer peripheral side of the wafer W to be placed than the wafer supporting portion for transfer 122, it is possible to enhance the quality of the obtained epitaxial wafer.

In addition to this, a configuration may be adopted in which the wafer supporting portion for film formation is moved in the vertical direction by electric drive. However, in the case of forming a SiC epitaxial wafer or the like, since the temperature in the furnace body 30 rises up to almost 1,500° C., it is required to shield the drive circuit and the like from the heat.

Further, the shape of the wafer supporting mechanism as seen in a plan view can also be variously changed.

Figure 7:
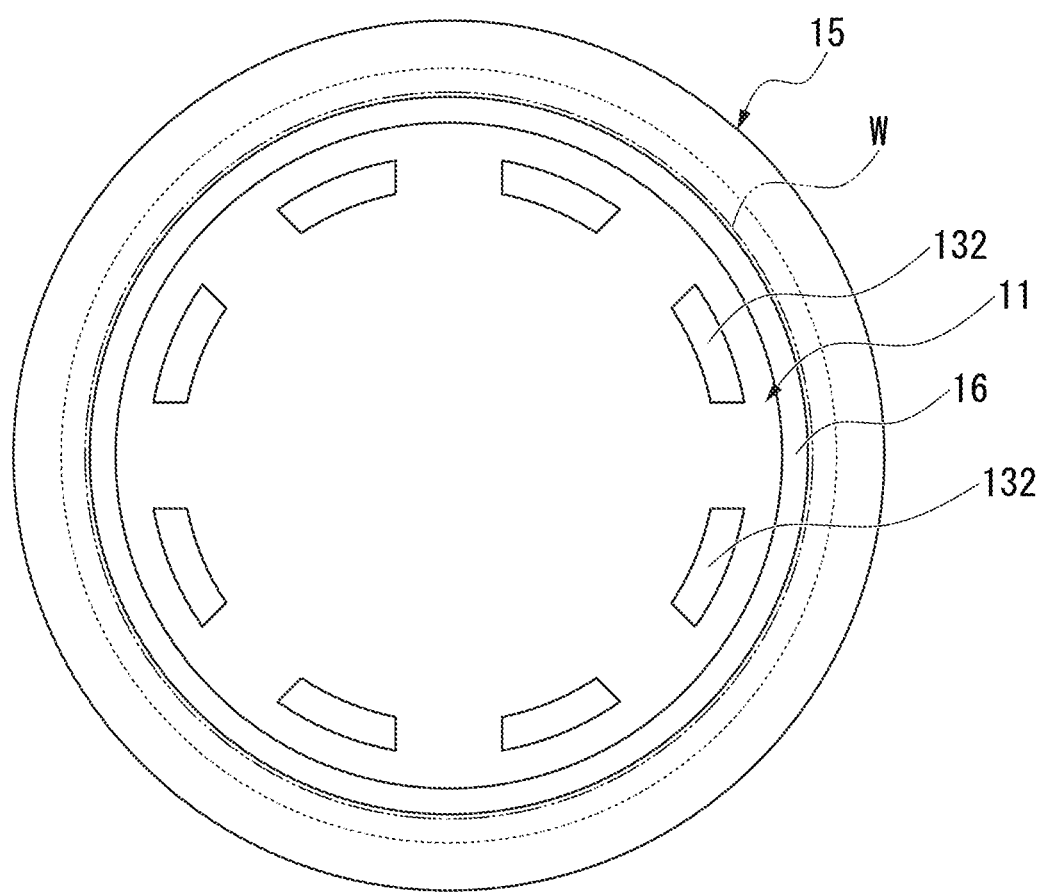
FIG. 7 shows a schematic plan view of a modified example of a wafer supporting mechanism according to one aspect of the present invention.

For example, in FIG. 3, both the wafer supporting portion for transfer 12 and the wafer supporting portion for film formation 16 are formed into an annular shape. The wafer supporting portion for transfer 12 and the wafer supporting portion for film formation 16 do not necessarily need to be annular, and wafer supporting portions for transfer 132 may be scattered about as shown in FIG. 7. Although the wafer supporting portions for transfer 132 may be randomly scattered about, it is preferable that they are present on a concentric circle from the viewpoint of stability. In this case, the "diameter of a circle formed by the wafer supporting portion for transfer" means the diameter of the largest circle that can be drawn by connecting the scattered wafer supporting portions for transfer 132.

Like the wafer supporting portions for transfer 132 shown in FIG. 7, the wafer supporting portion for film formation 16 may also have a shape in which a part of a circular ring is cut out.

Further, the installation part 20 is also not particularly limited as long as it can support the wafer supporting mechanism 10. For example, it can adopt various shapes such as a disc shape, an annular shape and the like.

(Method of Manufacturing Epitaxial Wafer)

The method of manufacturing an epitaxial wafer according to the present embodiment is a method of manufacturing an epitaxial wafer in which a wafer is transferred from a transfer space to a film formation space higher in temperature than the transfer space, and a layer is formed on the wafer in the film formation space.

The method of manufacturing an epitaxial wafer according to the present embodiment includes: a placing step of placing a wafer on a wafer supporting portion for transfer of a wafer supporting table; a transfer step of transferring the wafer together with the wafer supporting table from the transfer space to the film formation space; and a film formation step of installing the transferred wafer supporting table in the film formation space and forming a layer on the wafer. Hereinafter, a method of manufacturing an epitaxial wafer will be specifically described with reference to the chemical vapor deposition apparatus shown in FIG. 1 and the wafer supporting mechanism shown in FIG. 2 as examples.

First, the wafer W is placed on the wafer supporting portion for transfer 12 of the wafer supporting table 11. At this time, the wafer supporting portion for transfer 12 is set to be located further inside than the outer periphery of the wafer W to be placed thereon. It is preferable that the center of the circle formed by the wafer supporting portion for transfer 12 and the center of the wafer W to be placed are made to coincide. By making these centers coincide with each other, it is easy for the rotation axis of the supporting column 21 for supporting the installation part 20 to coincide with the center of the wafer W, and the obtained epitaxial wafer can be made homogeneous. Further, the stability of the wafer W at the time of transfer can also be enhanced.

Then, the wafer supporting mechanism 10 on which the wafer W is placed is introduced into a transfer space P and installed on an arm 41 for transfer. Installation of the arm 41 and the wafer supporting mechanism 10 is not particularly limited. For example, it is possible to provide a screw hole in the wafer supporting mechanism 10, insert the arm 41 into the screw hole, and install the wafer supporting mechanism 10 on the arm 41.

At this time, the temperature in the transfer space P is preferably about a temperature at which a person can perform an operation from the viewpoint of workability, and for example, it is preferably room temperature.

Next, the shutter 31 that partitions the furnace body 30 from the preparation chamber 40 is opened, and the wafer W is transferred together with the wafer supporting mechanism 10 from the transfer space P to the film formation space R. At this time, the transfer space P is subjected to a decompression treatment or the like as necessary.

It is preferable to reduce the degree of the temperature increase and decrease as much as possible in the film formation space R surrounded by the furnace body 30 in order to increase the production efficiency. Therefore, the temperature of the film formation space R is higher than that of the transfer space P. More specifically, for example, when fabricating a SiC epitaxial wafer, the temperature at which epitaxial growth is performed is 1,500° C. or higher. Therefore, it is preferable that the temperature of the film formation space R is 700° C. or more even at the time of transfer.

There is a temperature difference of about several hundred degrees Celsius between the transfer space P and the film formation space R. Due to the temperature difference, thermal stress is applied to the wafer W placed on the susceptor 10. A portion that is in contact with the wafer supporting mechanism 10 is relatively cooler than a portion that is not in contact therewith, and a temperature distribution is formed on the wafer. As the temperature difference increases, the thermal stress applied to the wafer W increases.

The thermal stress applied to the wafer W reaches the maximum at a portion supporting the wafer W. In the method of manufacturing an epitaxial wafer according to the present embodiment, the wafer supporting portion for transfer 12 is placed so as to be located further inside than the outer periphery of the wafer W to be placed in the placing step. Therefore, it is possible to avoid the application of an excessive moment to the wafer W, and cracking of the wafer W can be avoided.

The effect of suppressing cracking of the wafer W is effective if it is during transfer between environments having a temperature difference. Above all, this effect is particularly remarkable when an epitaxial wafer is produced which requires an extremely high temperature of about 1,500° C. for epitaxial growth such as SiC epitaxial wafers and the like. In the case of producing a SiC epitaxial wafer, as described above, the temperature of the film formation space R at the time of transfer is preferably 700° C. or more. For example, in a film forming apparatus for producing a SiC epitaxial wafer, the temperature difference between the transfer space P and the film formation space R is 650° C. or more.

The wafer supporting mechanism 10 transferred into the film formation space R is installed in the installation part 20 provided in the furnace body 30. In this process, the position for supporting the wafer is switched from the wafer supporting portion for transfer 12 to the wafer supporting portion for film formation 16. The switching direction is not particularly limited, but it can be realized by using, for example, the wafer supporting mechanism or the like shown in FIGS. 2, 5, and 6. It should be noted that the wafer supporting portion for film formation 16 is located further on the outer peripheral side of the wafer W than the wafer supporting portion for transfer 12.

Then, after switching portions for supporting the wafer W, an epitaxial layer is formed on the wafer W. The portion for supporting the wafer W is changed from the wafer supporting portion for transfer 12 that supports the wafer W at the time of transfer to the outer peripheral side of the wafer W.

As a method of forming an epitaxial layer, a known chemical vapor deposition (CVD) method or the like can be used. For example, in the case of growing an epitaxial layer on a SiC wafer, heating is performed while introducing a source gas, a dopant gas, an etching gas, a carrier gas and the like into the furnace body 30. The source gas decomposed by heating reacts on the surface of the SiC wafer, whereby the epitaxial layer grows and the SiC epitaxial wafer is obtained. Although the wafer supporting mechanism and the chemical vapor deposition apparatus according to the present embodiment can also be applied to devices other than the SiC epitaxial growth apparatus, it is particularly effective in, and preferably used for, SiC epitaxial growth where the epitaxial growth temperature is high.

According to the method of manufacturing a SiC epitaxial wafer according to the present embodiment, it is possible to avoid cracking of the wafer at the time of transfer. In addition, the epitaxial layer grown at the time of film formation can be made homogeneous.

Preferred embodiments of the present invention have been described in detail above. However the present invention is not limited to these embodiments, and various changes and modifications can be made within the scope of the present invention described in the claims.

Examples

Figure 8:
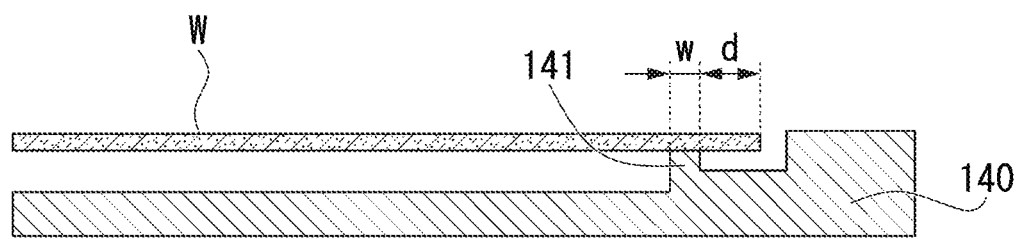
FIG. 8 shows a cross-sectional view of a wafer supporting table used for simulation.

The stress applied to the wafer when transferring the wafer at a high temperature was obtained by simulation. FIG. 8 is a cross-sectional view of a wafer supporting table used for simulation. A width w of a wafer supporting portion 141 of a wafer supporting table 140 was 2 mm. Then, the temperature below the wafer supporting table 140 was set to 1,000° C., and the temperature at the side thereof was set to 900° C. The temperature below the wafer supporting table corresponds to a heater for heating the susceptor in the chemical vapor deposition apparatus, and the temperature at the side thereof corresponds to radiation heating from the side surface of the furnace body.

Moreover, since the simulation result becomes bilaterally symmetric about the center of the wafer, simulation was performed from the center to one end of the wafer in order to suppress the calculation load.

In the following examples and the like, the stress applied to the wafer W was simulated while changing the distance d from the outer peripheral edge of the wafer W to the outer peripheral edge of the wafer supporting portion 141.

Comparative Example 1-1

The stress when a wafer having a diameter of 100 mm was placed on the wafer supporting table was determined. A portion supported by the wafer supporting portion was set at a position of 48 to 50 mm from the center of the wafer. That is, the outer periphery of the wafer supporting portion is provided at a position of 0 mm from the outer periphery of the placed wafer. The radius (50 mm) of the circle formed by the wafer supporting portion is 100% of the radius (50 mm) of the wafer to be placed.

Example 1-1

The stress when a wafer having a diameter of 100 mm was placed on the wafer supporting table was determined. A portion supported by the wafer supporting portion was set at a position of 46 to 48 mm from the center of the wafer. That is, the outer periphery of the wafer supporting portion is provided at a position of 2 mm from the outer periphery of the placed wafer. The radius (48 mm) of the circle formed by the wafer supporting portion is 96% of the radius (50 mm) of the wafer to be placed.

Example 1-2

The stress when a wafer having a diameter of 100 mm was placed on the wafer supporting table was determined. A portion supported by the wafer supporting portion was set at a position of 44 to 46 mm from the center of the wafer. That is, the outer periphery of the wafer supporting portion is provided at a position of 4 mm from the outer periphery of the placed wafer. The radius (46 mm) of the circle formed by the wafer supporting portion is 92% of the radius (50 mm) of the wafer to be placed.

Figure 9:
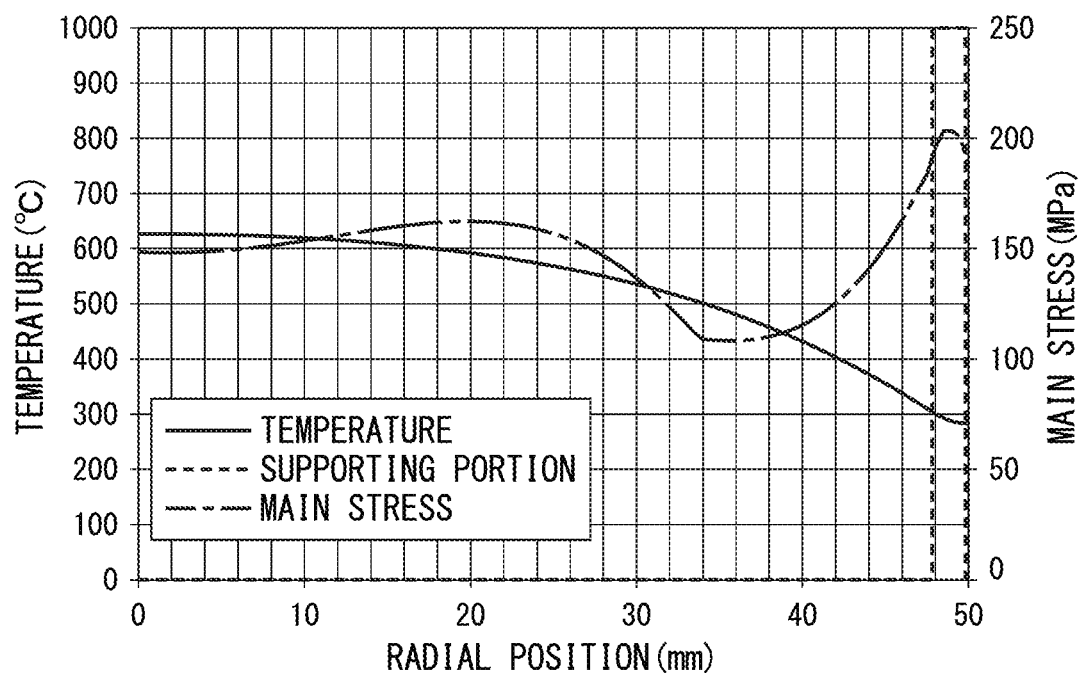
FIG. 9 is a diagram showing a simulation result under the conditions of Comparative Example 1-1.
Figure 10:
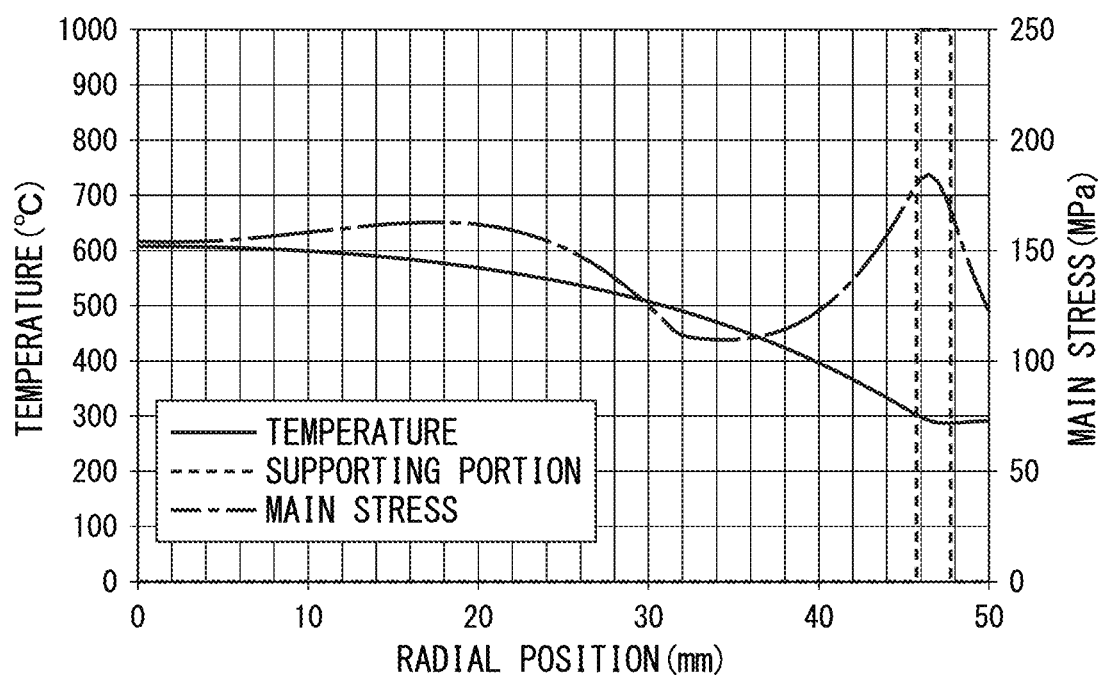
FIG. 10 is a diagram showing a simulation result under the conditions of Example 1-1.
Figure 11:
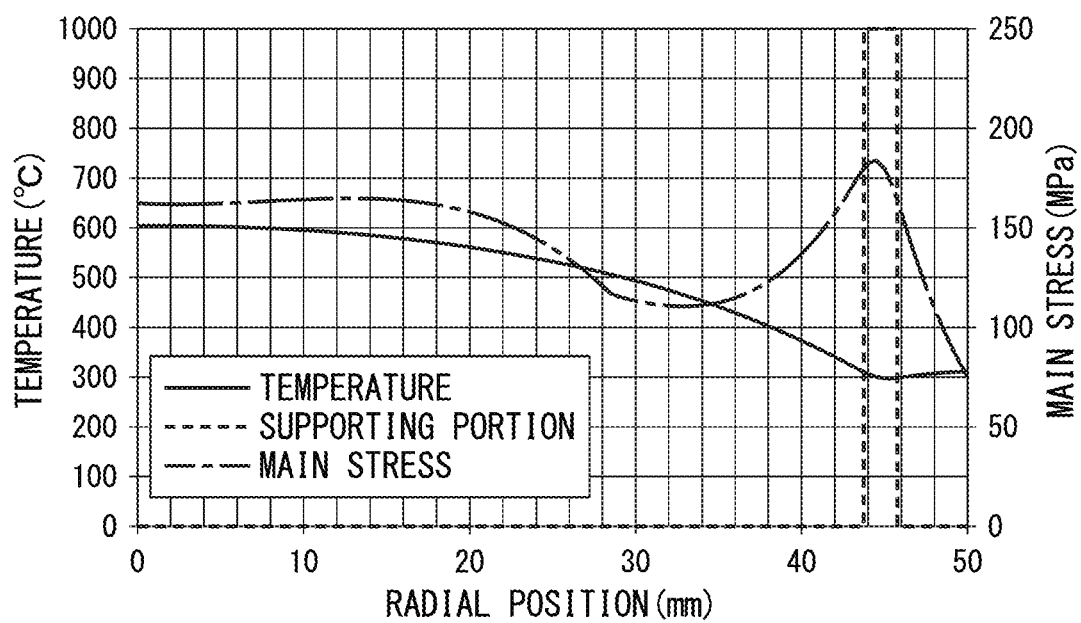
FIG. 11 is a diagram showing a simulation result under the conditions of Example 1-2.

FIGS. 9 to 11 are diagrams showing simulation results under the conditions of Comparative Example 1-1 and Examples 1-1 and 1-2. FIG. 9 corresponds to Comparative Example 1-1, FIG. 10 corresponds to Example 1-1, and FIG. 11 corresponds to Example 1-2.

As shown in FIGS. 9 to 11, the temperature of the wafer W is the lowest at a portion that is in contact with the wafer supporting portion. This is because the thermal conductivity differs between a portion that is in contact with the wafer supporting portion and a portion that is not in contact therewith.

Further, since the portion that is in contact with the wafer supporting portion has the lowest temperature, the greatest stress is applied to the portion that is in contact with the wafer supporting portion. The maximum stress is larger in Comparative Example 1-1 (FIG. 9) compared to those in Example 1-1 and Example 1-2 (FIG. 10, FIG. 11). When the lowest temperature portion is present in the middle of the diameter direction of the wafer as shown in FIG. 10 and FIG. 11, since the ambient temperature also changes gently, the stress is dispersed in the radial direction of the wafer. On the other hand, as shown in FIG. 9, when the lowest temperature portion is present at the edge portion of the wafer, the stress cannot be dispersed and the maximum stress increases.

Further, when the main stresses at the edge portions of the wafers are compared, they are 180 MPa in Comparative Example 1-1 (FIG. 9), 125 MPa in Example 1-1 (FIG. 10), and 75 MPa in Example 1-2 (FIG. 11). In the wafer, the breaking strength of the outer peripheral portion is smaller than the breaking strength of the inner portion. Therefore, the wafer cracks more easily when a stress is applied to the outer peripheral portion rather than to the inner peripheral portion. In order to suppress the cracking of the wafer, it is important to reduce the stress to the outer peripheral portion. By setting the position of the wafer supporting portion further inside than the outer periphery of the wafer to be placed, it is possible to reduce the stress to the outer peripheral portion and to suppress the cracking of the wafer.

Then, a similar simulation was performed by changing the wafer size to 6 inches.

Comparative Example 2-1

The stress when a wafer having a diameter of 150 mm was placed on the wafer supporting table was determined. A portion supported by the wafer supporting portion was set at a position of 73 to 75 mm from the center of the wafer. That is, the outer periphery of the wafer supporting portion is provided at a position of 0 mm from the outer periphery of the placed wafer. The radius (75 mm) of the circle formed by the wafer supporting portion is 100% of the radius (75 mm) of the wafer to be placed.

Example 2-1

The stress when a wafer having a diameter of 150 mm was placed on the wafer supporting table was determined. A portion supported by the wafer supporting portion was set at a position of 71 to 73 mm from the center of the wafer. That is, the outer periphery of the wafer supporting portion is provided at a position of 2 mm from the outer periphery of the placed wafer. The radius (73 mm) of the circle formed by the wafer supporting portion is 97% of the radius (75 mm) of the wafer to be placed.

Example 2-2

The stress when a 6-inch wafer (having a diameter of 152.4 mm) was placed on the wafer supporting table was determined. A portion supported by the wafer supporting portion was set at a position of 69 to 71 mm from the center of the wafer. That is, the outer periphery of the wafer supporting portion is provided at a position of 4 mm from the outer periphery of the placed wafer. The radius (71 mm) of the circle formed by the wafer supporting portion is 95% of the radius (75 mm) of the wafer to be placed.

Figure 12:
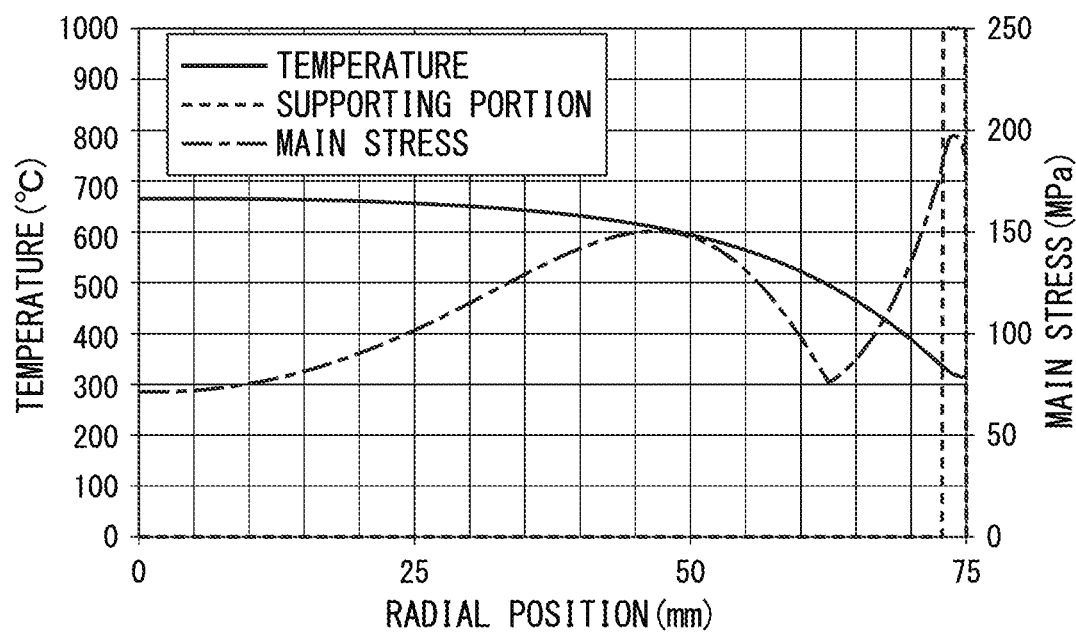
FIG. 12 is a diagram showing a simulation result under the conditions of Comparative Example 2-1.
Figure 13:
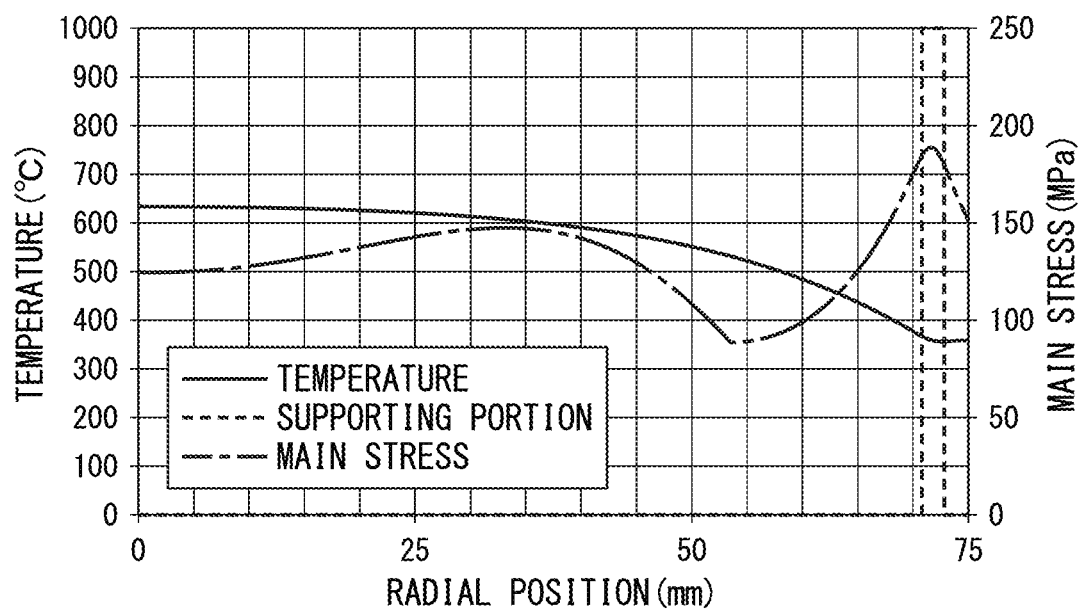
FIG. 13 is a diagram showing a simulation result under the conditions of Example 2-1.
Figure 14:
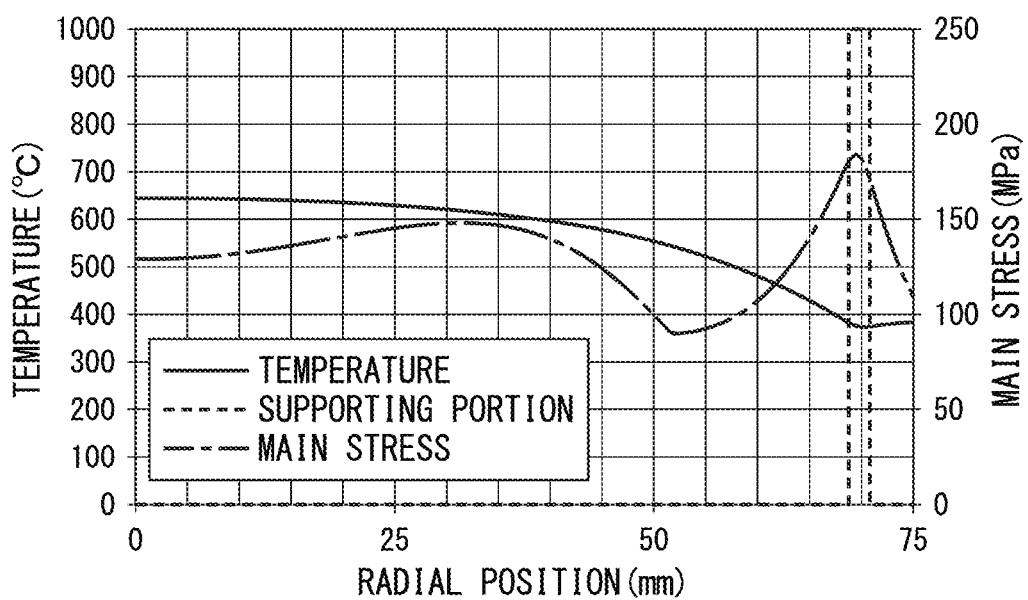
FIG. 14 is a diagram showing a simulation result under the conditions of Example 2-2.

FIGS. 12 to 14 are diagrams showing simulation results under the conditions of Comparative Example 2-1 and Examples 2-1 and 2-2. FIG. 12 corresponds to Comparative Example 2-1, FIG. 13 corresponds to Example 2-1, and FIG. 14 corresponds to Example 2-2.

As shown in FIGS. 12 to 14, even if the wafer size is increased, the temperature of the wafer W is the lowest at a portion that is in contact with the wafer supporting portion.

Further, the maximum stress is larger in Comparative Example 2-1 (FIG. 12) compared to those in Example 2-1 and Example 2-2 (FIG. 13, FIG. 14). It is considered that this is because the lowest temperature portion is present at the edge portion of the wafer, and thus the stress cannot be dispersed.

Further, when the main stresses at the edge portions of the wafers are compared, they are 180 MPa in Comparative Example 2-1 (FIG. 12), 150 MPa in Example 2-1 (HG 13) and 110 MPa in Example 2-2 (FIG. 14). In the wafer, the breaking strength of the outer peripheral portion is smaller than the breaking strength of the inner portion. Therefore, the wafer cracks more easily when a stress is applied to the outer peripheral portion rather than to the inner peripheral portion. In order to suppress the cracking of the wafer, it is important to reduce the stress to the outer peripheral portion. By setting the position of the wafer supporting portion further inside than the outer periphery of the wafer to be placed, it is possible to reduce the stress to the outer peripheral portion and to suppress the cracking of the wafer.

REFERENCE SIGNS LIST

100: Chemical vapor deposition apparatus; 10, 110: Wafer supporting mechanism; 11, 120, 140: Wafer supporting table; 11a, 120a: First surface; 11b: Second surface; 11A, 120A: Through hole; 12, 122, 132: Wafer supporting portion for transfer; 12a, 16a, 116a, 126a: Upper surface; 15, 115: Movable part; 15a: Extension portion; 15b: Suspension portion; 16, 116, 126: Wafer supporting portion for film formation; 115b: Protrusion portion; 17, 117: Push-up portion; 20: Installation part; 21: Supporting column; 30: Furnace body; 31: Shutter; 40: Preparation chamber; 41: Arm; 141: Wafer supporting portion; P: Transfer space; R: Film formation space; W: Wafer; Wb: Back surface

The invention claimed is:

1. A wafer supporting mechanism comprising:
a wafer supporting table; and
a circular part, which is configured to be disposed on and supported by the wafer supporting table during a transferred state,
wherein the wafer supporting table comprises a first wafer supporting portion which is configured to transfer a wafer,
wherein the first wafer supporting portion stands up from a first surface of the wafer supporting table, which opposes a back surface of the wafer to be placed, and is provided further toward an inner side than an outer peripheral edge of the wafer to be placed, and
the circular part comprises a second wafer supporting portion, which is positioned further toward an outer peripheral side of the wafer to be placed than the first wafer supporting portion,
wherein the circular part is configured to relatively move with respect to the wafer supporting table in a standing direction of the first wafer supporting portion,
a part of the circular part protrudes downward and is located lower than a second surface of the wafer supporting table when the circular part is suspended from and supported by the wafer supporting table, which is supported by an arm, wherein the second surface of the wafer supporting table is located on an opposite side of the first surface of the wafer supporting table, and
wherein the circular part is movable via the arm during the transferred state.

2. The wafer supporting mechanism according to claim 1, wherein a diameter of a circle formed by the first wafer supporting portion is equal to or less than 97% of a diameter of the wafer to be placed.

3. The wafer supporting mechanism according to claim 1, wherein at least a part of the circular part protrudes from the second surface of the wafer supporting table.

4. The wafer supporting mechanism according to claim 1, further comprising a base, on which the wafer supporting mechanism is configured to be installed,
wherein by installing the wafer supporting mechanism on the base, the circular part is placed on the base, and
a support position of the wafer is switchable from the first wafer supporting portion to the second wafer supporting portion.

5. A chemical vapor deposition apparatus comprising the wafer supporting mechanism according to claim 1.

6. The wafer supporting mechanism according to claim 1, wherein when the circular part is suspended from the wafer supporting table, an upper surface of the second wafer supporting portion on the wafer side is present below an upper surface of the first wafer supporting portion on the wafer side.

7. The wafer supporting mechanism according to claim 1, wherein an upper surface of the second wafer supporting portion is located higher than an upper surface of the first wafer supporting portion, when a film is formed on the wafer.

8. The wafer supporting mechanism according to claim 1, wherein the second wafer supporting portion is located further on the outer peripheral side of the wafer than the first wafer supporting portion in plan view.

9. The wafer supporting mechanism according to claim 1, wherein, when the circular part moves upward, the second wafer supporting portion moves upward together with the circular part, and an upper surface of the second wafer supporting portion and a back surface of the wafer come into contact.

10. The wafer supporting mechanism according to claim 1, wherein, when the second wafer supporting portion is moved upward, the second wafer supporting portion supports the wafer.

11. The wafer supporting mechanism according to claim 1, wherein, when the second wafer supporting portion is moved upward, the second wafer supporting portion supports the wafer, and the first wafer supporting portion does not support the wafer.

12. The wafer supporting mechanism according to claim 1, wherein the first wafer supporting portion is a protruding portion protruded upward from the wafer supporting table, and the second wafer supporting portion is a protruding portion protruded upward from the circular part.

13. The wafer supporting mechanism according to claim 1, wherein the circular part has an extension portion which extends along the first surface of the wafer supporting table from an outer peripheral edge toward a center of the wafer supporting table.

14. The wafer supporting mechanism according to claim 1, wherein an extension portion of the circular part is configured to rest on the wafer supporting table to support the circular part when the circular part is in the transferred state.

15. The wafer supporting mechanism according to claim 1, wherein the wafer supporting table is configured to support the wafer when the circular part is in the transferred state; and the circular part has an extension portion configured to be disposed on and supported by a same side of the wafer supporting table which is configured to support the wafer when the circular part is in the transferred state.

16. The wafer supporting mechanism according to claim 1, wherein the wafer supporting table has a circular shape in plan view, the first wafer supporting portion has an annular shape in plan view, the circular part has an annular shape in plan view, and a second wafer supporting portion has an annular shape in plan view.

* * * * *